(12) United States Patent
Cho

(10) Patent No.: US 9,570,379 B2
(45) Date of Patent: Feb. 14, 2017

(54) POWER SEMICONDUCTOR PACKAGE WITH INTEGRATED HEAT SPREADER AND PARTIALLY ETCHED CONDUCTIVE CARRIER

(71) Applicant: Infineon Technologies Americas Corp., El Segundo, CA (US)

(72) Inventor: Eung San Cho, Torrance, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/546,762

(22) Filed: Nov. 18, 2014

(65) Prior Publication Data

US 2015/0162261 A1   Jun. 11, 2015

Related U.S. Application Data

(63) Continuation-in-part of application No. 14/515,720, filed on Oct. 16, 2014, and a continuation-in-part of application No. 14/515,860, filed on Oct. 16, 2014.

(60) Provisional application No. 61/913,497, filed on Dec. 9, 2013.

(51) Int. Cl.
| | |
|---|---|
| H01L 23/28 | (2006.01) |
| H01L 23/495 | (2006.01) |
| H01L 23/00 | (2006.01) |
| H01L 29/778 | (2006.01) |
| H01L 29/20 | (2006.01) |

(52) U.S. Cl.
CPC ... *H01L 23/49562* (2013.01); *H01L 23/49524* (2013.01); *H01L 23/49568* (2013.01); *H01L 24/36* (2013.01); *H01L 24/40* (2013.01); *H01L 24/41* (2013.01); *H01L 29/2003* (2013.01); *H01L 29/7788* (2013.01); *H01L 2224/16* (2013.01); *H01L 2224/32245* (2013.01); *H01L 2224/40245* (2013.01); *H01L 2224/4103* (2013.01); *H01L 2924/0002* (2013.01); *H01L 2924/13055* (2013.01); *H01L 2924/13091* (2013.01); *H01L 2924/181* (2013.01)

(58) Field of Classification Search
None
See application file for complete search history.

(56) References Cited

U.S. PATENT DOCUMENTS

| | | | |
|---|---|---|---|
| 6,624,522 | B2 | 9/2003 | Standing |
| 7,271,470 | B1 | 9/2007 | Otremba |
| 7,285,849 | B2 | 10/2007 | Cruz |
| 7,301,235 | B2 | 11/2007 | Schaffer |
| 7,663,212 | B2 | 2/2010 | Otremba |
| 7,800,217 | B2 | 9/2010 | Otremba |
| 8,304,903 | B2 | 11/2012 | Herbsommer |

(Continued)

*Primary Examiner* — Calvin Choi
(74) *Attorney, Agent, or Firm* — Shumaker & Sieffert, P.A.

(57) ABSTRACT

In one implementation, a power semiconductor package includes a power transistor having a first power electrode and a gate electrode on its bottom surface, and a second power electrode on its top surface. The first power electrode is configured for attachment to a first partially etched conductive carrier segment and the gate electrode is configured for attachment to a second partially etched conductive carrier segment. The power semiconductor package also includes a power electrode heat spreader situated over the second power electrode and configured for attachment to a power electrode conductive carrier segment.

22 Claims, 8 Drawing Sheets

(56) References Cited

U.S. PATENT DOCUMENTS

| | | | |
|---|---|---|---|
| 8,680,656 B1 | 3/2014 | Kuo | |
| 8,884,420 B1 * | 11/2014 | Hosseini | H01L 23/49575 257/676 |
| 2004/0061221 A1 | 4/2004 | Schaffer | |
| 2006/0017174 A1 | 1/2006 | Otremba | |
| 2006/0151861 A1 * | 7/2006 | Noquil | H01L 23/36 257/676 |
| 2007/0090523 A1 | 4/2007 | Otremba | |
| 2007/0114352 A1 | 5/2007 | Cruz | |
| 2009/0224383 A1 | 9/2009 | Cruz | |
| 2010/0133670 A1 | 6/2010 | Liu | |
| 2011/0049690 A1 | 3/2011 | Cho | |
| 2012/0015483 A1 | 1/2012 | Herbsommer | |
| 2012/0181674 A1 | 7/2012 | Cho | |
| 2012/0241926 A1 | 9/2012 | Camacho | |
| 2012/0248521 A1 | 10/2012 | Herbsommer | |
| 2012/0280308 A1 * | 11/2012 | Disney | H01L 23/49575 257/329 |
| 2012/0292752 A1 | 11/2012 | Cho | |
| 2012/0292753 A1 | 11/2012 | Cho | |
| 2013/0161801 A1 | 6/2013 | Otremba | |

* cited by examiner

POWER SEMICONDUCTOR PACKAGE WITH INTEGRATED HEAT SPREADER AND PARTIALLY ETCHED CONDUCTIVE CARRIER

The present application claims the benefit of and priority to a provisional application entitled "Recessed Lead Frame Semiconductor Package with Integrated Heat Spreader," Ser. No. 61/913,497, filed on Dec. 9, 2013. The disclosure in this provisional application is hereby incorporated fully by reference into the present application. The present application is also a continuation-in-part of, and claims the benefit of and priority to parent patent application entitled "Compact Single-Die Power Semiconductor Package," Ser. No. 14/515,720, filed on Oct. 16, 2014. The disclosure in this parent application is hereby incorporated fully by reference into the present application. The present application is also a continuation-in-part of, and claims the benefit of and priority to parent patent application entitled "Compact Multi-Die Power Semiconductor Package," Ser. No. 14/515,860, filed on Oct. 16, 2014. The disclosure in this parent application is also hereby incorporated fully by reference into the present application.

BACKGROUND

For optimization of form factor, performance, and manufacturing cost, it is often desirable to integrate components of a power circuit, such as a half-bridge based DC-DC converter or a voltage converter, in a single semiconductor package. Thus, several semiconductor package designs have been developed to integrate the power transistors of a power circuit within a compact package. To provide sufficient electrical performance for the reliable operation of high power semiconductor packages, it is crucial to ensure high current carrying capability and low resistance for connection between the transistors of the power circuit.

Various high power semiconductor package designs use at least one conductive clip and a separate heat spreader for coupling transistors to a substrate, undesirably increasing electrical resistance and reducing current carrying capability. Additionally, package design rules to successfully accommodate multiple leadframes, a separate heat spreader, and a conductive clip require a large degree of tolerance (i.e. a large clearance space) for manufacturing, thus undesirably increasing package form factor and complexity. For example, package height and width have to be increased to provide sufficient space for the multiple leadframes, the separate heat spreader, and the conductive clip, and additional area on the package may be reserved for necessary electrical connections. Additionally, the increased package complexity resulting from the use of multiple leadframes, the separate heat spreader and the conductive clip may negatively affect manufacturing time, cost, and package yields.

SUMMARY

The present disclosure is directed to a power semiconductor package with integrated heat spreader and partially etched conductive carrier, substantially as shown in and/or described in connection with at least one of the figures, and as set forth more completely in the claims.

DETAILED DESCRIPTION

Figure 1:
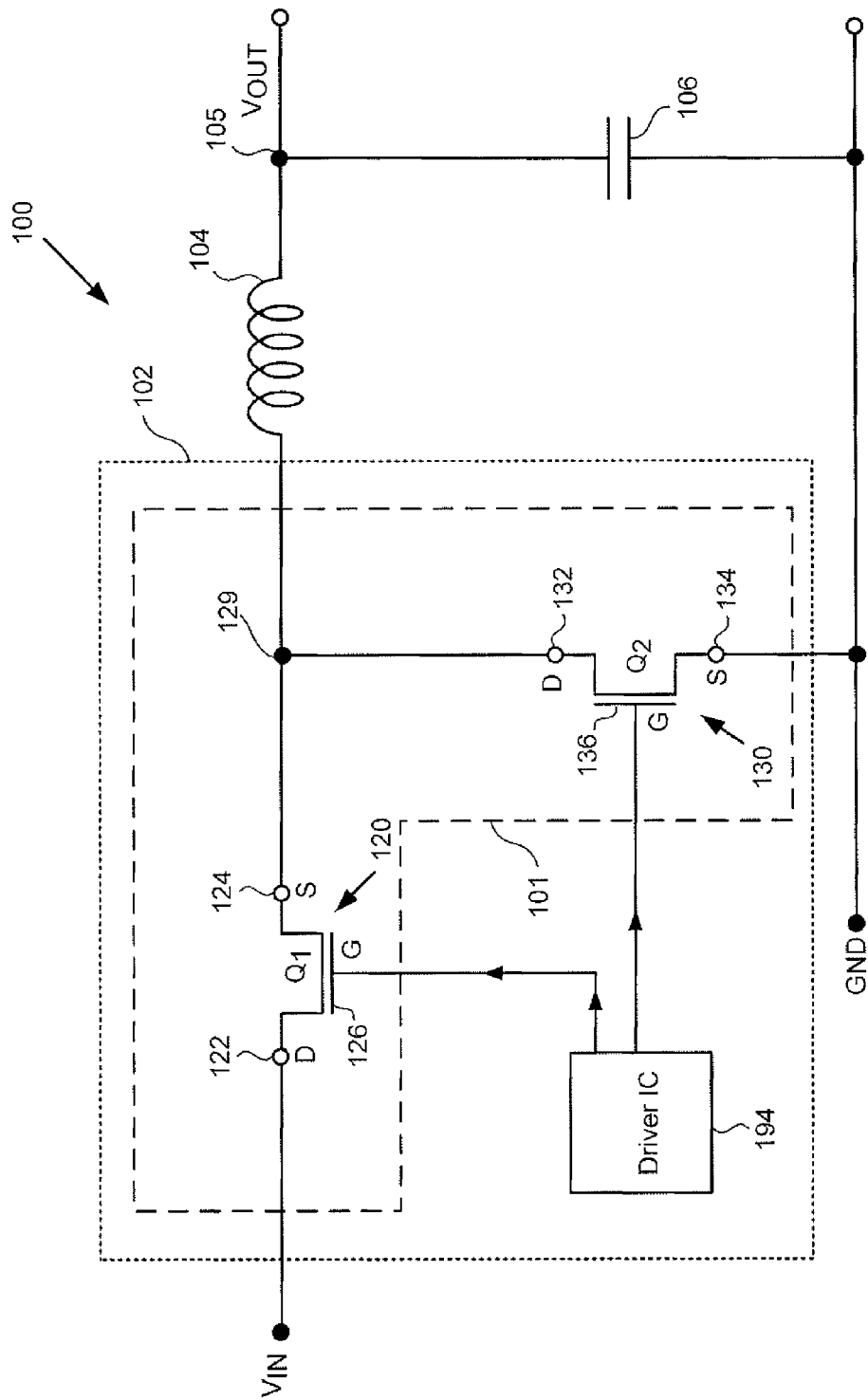
FIG. 1 illustrates a diagram of an exemplary circuit suitable for use as a voltage converter.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Power transistors used in voltage conversion applications are capable of generating substantial heat during operation. The potentially damaging heat can be diverted away from the power transistors using a heat spreader, which in conventional implementations is often relatively large. As a result, packaging solutions for power transistors must typically be sized to accommodate not only the power transistor but also a large heat spreader providing thermal protection for the power transistor.

In addition, due to typical configuration of power transistor electrodes, connection to one of the power electrodes, i.e., source or drain electrode, is typically implemented using a conductive clip formed from a conductive body typically merged with and supported at one end by a downward pointing conductive leg. Due to the high current that must be accommodated by the conductive clip, it is generally desirable that the conductive body and its conductive support leg have a relatively large cross-sectional area. Moreover, because a power transistor can be highly sensitive to electrical resistance, the cross-sectional area of the conductive clip can have a significant effect on device performance.

However, as advances in technology enable implementation of ever thinner power transistors, use of a conductive clip gives rise to conflicting constraints. For example, the permissible thickness of the conductive body portion of a conductive clip can be limited by the height of its support leg. As power transistors are implemented using ever thinner transistors, the conductive clip support leg requires a reduced height to properly position the conductive body of the conductive clip for contact with a power electrode at a surface of the thinner power transistor. Consequently, the limitation on the thickness of the conductive body of the conductive clip imposed by the reduction in height of the conductive leg of the conductive clip results in a reduction of the effective cross-sectional area of the conductive clip, which can undesirably impair performance.

The present application discloses a packaging solution enabling omission of the aforementioned conductive clip, by integrating its functionality with a heat spreader. The disclosed implementations utilize a conductive carrier, such as a semiconductor package lead frame, having at least one partially etched conductive carrier segment to enable use of a heat spreader to provide a reliable, low resistance, and substantially parasitic free electrical connection. The heat spreader is implemented to provide an electrical coupling of a power electrode of the power transistor to the conductive carrier while concurrently providing thermal protection for the power transistor.

The power transistor package of the present application may be implemented within a voltage converter, for example. Voltage converters are used in a variety of electronic circuits and systems. For example, various applications may require conversion of a direct current (DC) input to a lower, or higher, DC output. As a specific example, a buck converter may be implemented as a voltage regulator to convert a higher voltage DC input to a lower voltage DC output for use in low voltage applications.

FIG. 1 illustrates a diagram of an exemplary circuit suitable for use as a voltage converter. Voltage converter 100 includes voltage converter multi-chip module (MCM) 102, output inductor 104, and output capacitor 106. As shown in FIG. 1, MCM 102 includes power switching stage 101 of voltage converter 100, and driver IC 194 implemented to provide drive signals to power switching stage 101. As shown in FIG. 1, voltage converter 100 is configured to receive an input voltage $V_{IN}$, and to provide a converted voltage, e.g., a rectified and/or stepped down voltage, as $V_{OUT}$ at output 105.

Power switching stage 101 may be implemented using two power transistors in the form of metal-oxide-semiconductor field-effect transistors (MOSFETs) configured as a half bridge, for example. That is to say, power switching stage 101 may include high side or control transistor 120 ($Q_1$) having drain 122, source 124, and gate 126, as well as low side or sync transistor 130 ($Q_2$) having drain 132, source 134, and gate 136. Control transistor 120 is coupled to sync transistor 130 at switch node 129, which, in turn, is coupled to output 105 through output inductor 104. Respective control and sync transistors 120 and 130 may be implemented as field-effect transistors (FETs), insulated gate bipolar transistors (IGBTs), or high electron mobility transistors (HEMTs), for example. More specifically, respective control and sync transistors 120 and 130 may be implemented as silicon FETs or gallium nitride (GaN) FETs. In general, control transistor 120 and sync transistor 130 may be implemented as group IV power transistors, such as silicon power transistors, or as group III-V power transistors, such as GaN power transistors. Voltage converter 100 may be advantageously used, for example as a buck converter, in a variety of automotive, industrial, appliance, and lighting applications.

Figure 4A:
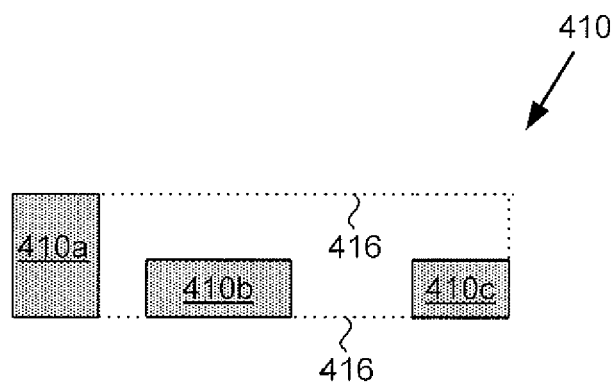
FIG. 4A illustrates a cross-sectional view of an implementation of the present disclosure, corresponding to an initial step in the flowchart in FIG. 2.
Figure 4B:
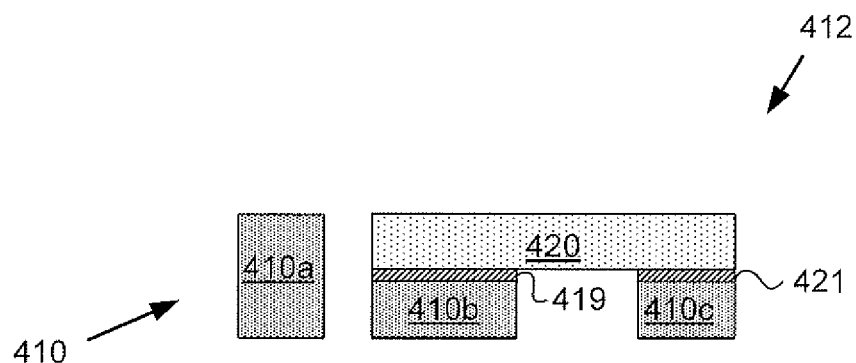
FIG. 4B illustrates a cross-sectional view of an implementation of the present disclosure, corresponding to an intermediate step in the flowchart in FIG. 2.
Figure 4C:
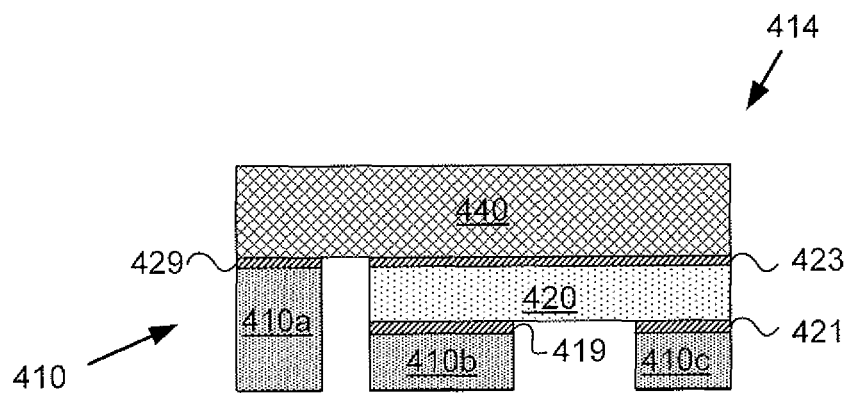
FIG. 4C illustrates a cross-sectional view of an implementation of the present disclosure, corresponding to a final step in the flowchart in FIG. 2.
Figure 4D:
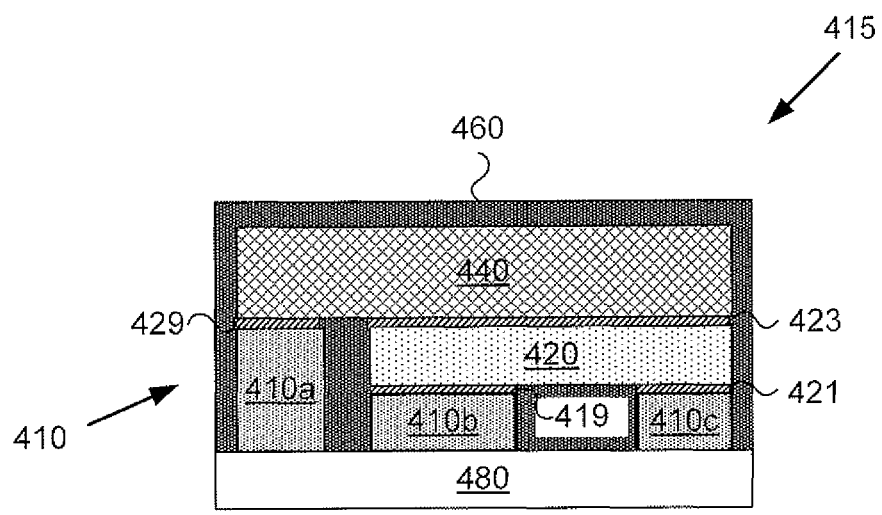
FIG. 4D illustrates a cross-sectional view of an implementation of the present disclosure.
Figure 6A:
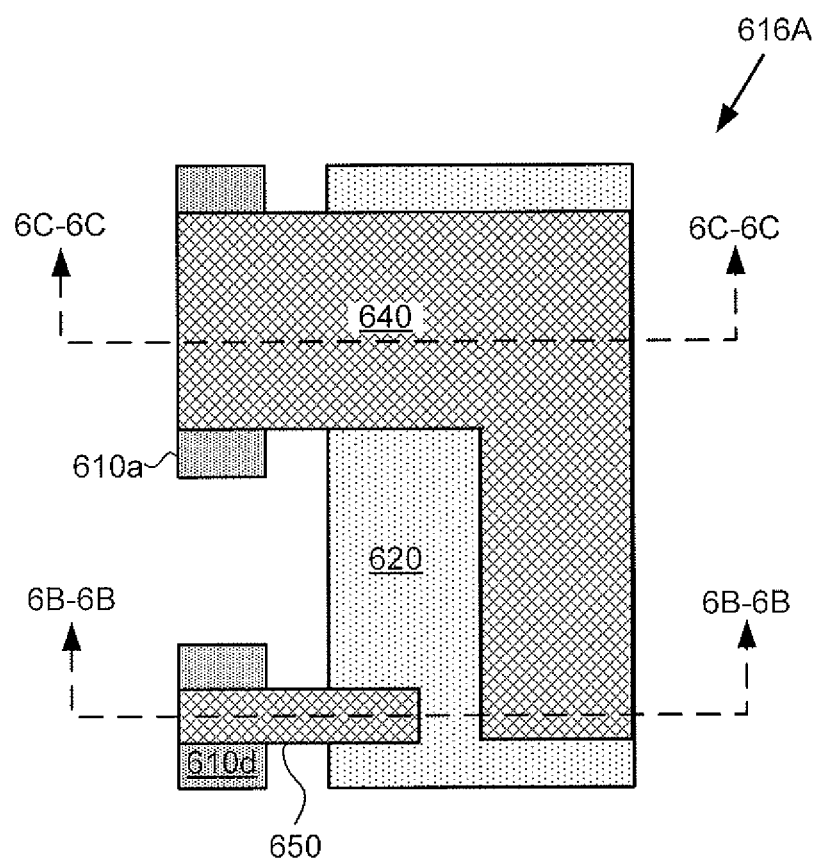
FIG. 6A illustrates a top view of another implementation of the present disclosure, corresponding to an optional step in the flowchart in FIG. 2.
Figure 6B:
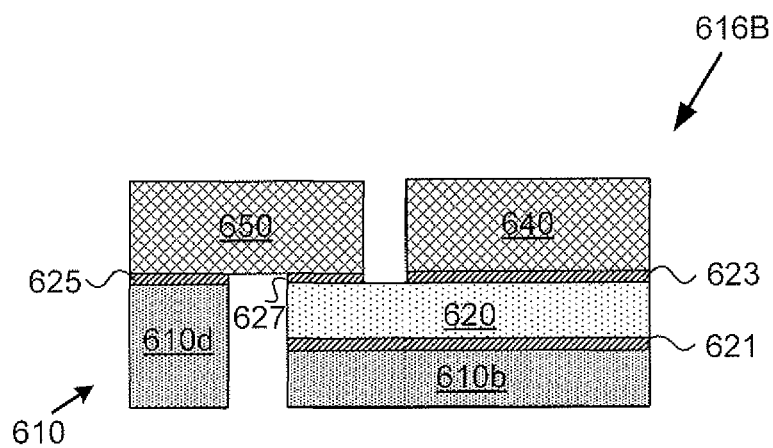
FIG. 6B illustrates a cross-sectional view of another implementation of the present disclosure, corresponding to the optional step in the flowchart in FIG. 2.
Figure 6C:
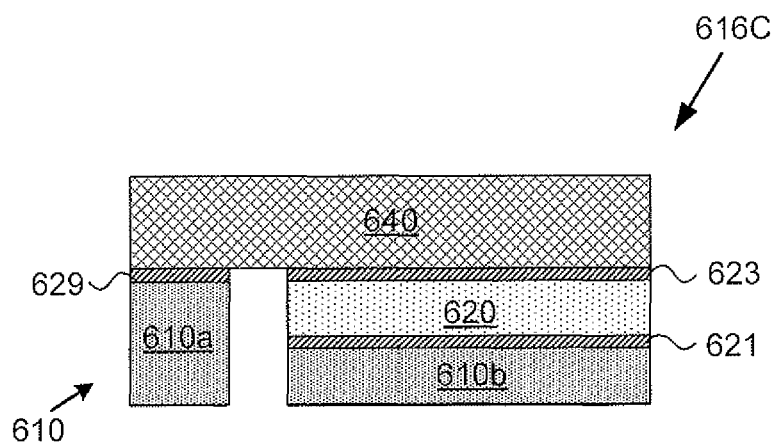
FIG. 6C illustrates a cross-sectional view of another implementation of the present disclosure, corresponding to the optional step in the flowchart in FIG. 2.

It should be noted with reference to the drawings, that implementations of the present disclosure are described with respect to a single power transistor within a power semiconductor package, such as power transistor 420 within power semiconductor package 412 of FIG. 4B, power semiconductor package 414 of FIG. 4C, power semiconductor package 415 of FIG. 4D, and power transistor 620 within power semiconductor package 616E of FIG. 6B and power semiconductor package 616C of FIG. 6C. Each power transistor 420 and power transistor 620 may correspond to a power transistor such as control transistor 120 or sync transistor 130 of FIG. 1. In some implementations, a circuit board may include power transistor 420 corresponding to control transistor 120 and another power transistor 420 corresponding to sync transistor 130 electrically coupled to one another in a manner shown in voltage converter 100 of FIG. 1.

As another example, in one implementation, power transistor 420 of FIG. 4D may correspond to control transistor 120 and another power transistor 420 may correspond to sync transistor 130. Each power transistor 420 may be electrically coupled to a driver IC, an output inductor, and an output capacitor, such as driver IC 194, output inductor 104, and output capacitor 106 of FIG. 1, according to the exemplary voltage converter 100 of FIG. 1.

It should further be noted that in the interests of ease and conciseness of description, the present inventive principles will in some instances be described by reference to specific implementations of a buck converter including one or more silicon based power FETs. However, it is emphasized that such implementations are merely exemplary, and the inventive principles disclosed herein are broadly applicable to a wide range of applications, including buck and boost converters, implemented using other group IV based, or group III-V based, power transistors.

It is further noted that as used herein, the phrase "group III-V" refers to a compound semiconductor including at least one group III element and at least one group V element. By way of example, a group III-V semiconductor may take the form of a III-Nitride semiconductor that includes nitrogen and at least one group III element. For instance, a III-Nitride power transistor may be fabricated using gallium nitride (GaN), in which the group III element or elements include some or a substantial amount of gallium, but may also include other group III elements in addition to gallium.

Figure 2:
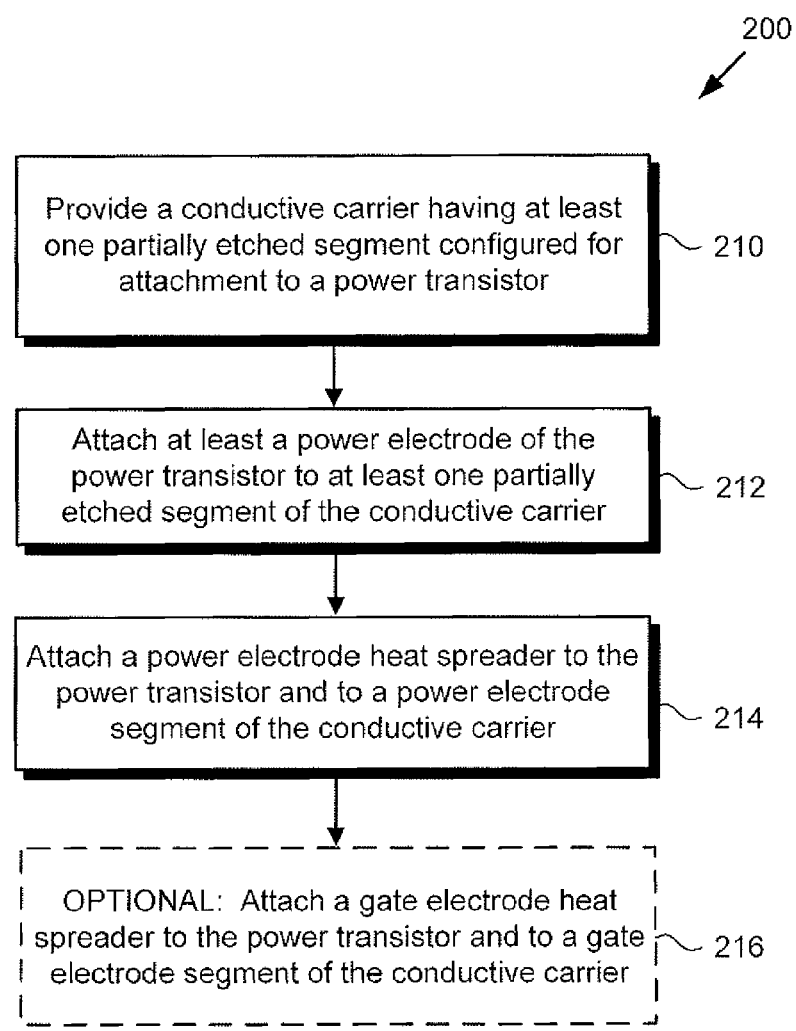
FIG. 2 shows a flowchart illustrating actions taken according to one implementation of the present disclosure.

Referring to FIG. 2, FIG. 2 shows a flowchart illustrating the actions taken according to one implementation of the present disclosure. It is noted that the method described by flowchart 200 is performed on a portion of a conductive carrier structure, which may be a semiconductor package lead frame, or may take the form of a conductive sheet or plate, for example.

With respect to FIGS. 4A, 4B, 4C, and 6B, the structures shown in those figures illustrate the results of performing various actions according to the method of flowchart 200. For example, FIG. 4A shows a cross-sectional view after performance of action 210 in providing a conductive carrier having at least one partially etched segment configured for attachment to a power transistor. FIG. 4B shows a cross sectional view after performance of action 212 in attaching at least a power electrode of the power transistor to at least one partially etched segment of the conductive carrier, and so forth.

Figure 3:
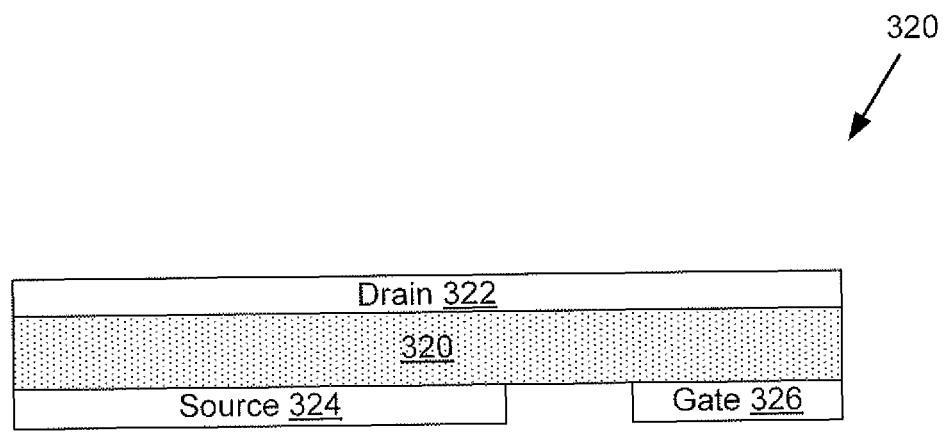
FIG. 3 illustrates a cross-sectional view of a power transistor for use in a power semiconductor package.

FIG. 3 illustrates a simplified cross-sectional view of a power transistor for use in a power semiconductor package. Power transistor 320 of FIG. 3 includes drain electrode 322, source electrode 324, and gate electrode 326. Drain electrode 322 is a power electrode situated on a top surface of power transistor 320. Source electrode 324 is a power electrode situated on a bottom surface of power transistor 320. Gate electrode 326 is a gate electrode situated on the bottom surface of power transistor 320. In some implementations, power transistor 420 of FIG. 4B, FIG. 4C, and FIG. 4D discussed below has the same drain electrode, source electrode, and gate electrode configuration as power transistor 320 of FIG. 3. However, the present disclosure is not limited to the implementation of FIG. 3. For example, in one implementation, the configuration of source electrode 324 and gate electrode 326 of power transistor 320 may be reversed.

Referring to flowchart 200, flowchart 200 begins at action 210 with providing a conductive carrier having at least one partially etched segment configured for attachment to a power transistor. For example, conductive carrier 410 of FIG. 4A is provided having power electrode conductive carrier segment 410a, partially etched conductive carrier segment 410b, and partially etched conductive carrier segment 410c configured for attachment to a power transistor, such as power transistor 420 of FIG. 4B.

Referring to FIG. 4A, conductive carrier 410 of FIG. 4A includes power electrode conductive carrier segment 410a, partially etched conductive carrier segment 410b, and partially etched conductive carrier segment 410c.

Conductive carrier 410 may be a semiconductor package lead frame, or may take the form of a conductive sheet or plate, for example. Conductive carrier 410 may be a fully patterned conductive carrier formed of any conductive material having a suitably low electrical resistance. Conductive carrier 410 is configured to sink heat from a power transistor into a substrate. Conductive carrier 410 may include copper (Cu), aluminum (Al), or a conductive alloy, for example.

Partially etched conductive carrier segment 410b and partially etched conductive carrier segment 410c may be fabricated using a partial etch performed on a top and/or a bottom side of partially etched conductive carrier segment 410b and partially etched conductive carrier segment 410c, for example. In some implementations, partially etched conductive carrier segment 410b and partially etched conductive carrier segment 410c may be fabricated by performing a half-etch, for example. In such an implementation, partially etched conductive carrier segment 410b and partially etched conductive carrier segment 410c may be half the thickness of power electrode conductive carrier segment 410a.

Although not shown in the present drawings, in some implementations, conductive carrier 410 may include a barrier metal layer formed on a top and/or a bottom of conductive carrier 410. The barrier metal layer may include nickel-gold (NiAu) or nickel-palladium-gold (NiPdAu), for example. In some implementations, the barrier metal layer may serve as an etching mask during patterning of conductive carrier 410.

It is noted that power electrode conductive carrier segment 410a, partially etched conductive carrier segment 410b, and partially etched conductive carrier segment 410c are shown as connected by dashed lines 416 to indicate that the gaps between those respective segments may be visible in FIG. 4A due to the cross-sectional perspective viewed in FIG. 4A, but dashed lines 416 do not extend through conductive carrier 410 in a direction perpendicular to the plane of the page of FIG. 4A. Thus conductive carrier 410 may be provided by a single, substantially continuous, conductive carrier support structure, fully patterned to provide power electrode conductive carrier segment 410a, partially etched conductive carrier segment 410b, and partially etched conductive carrier segment 410c.

Referring again to flowchart 200, flowchart 200 continues at action 212 with attaching at least a power electrode of the power transistor to at least one partially etched segment of the conductive carrier. For example, power semiconductor package 412 of FIG. 4B includes conductive carrier 410 of FIG. 4A after a power electrode and a gate electrode of power transistor 420 are attached to partially etched conductive carrier segment 410b and partially etched conductive carrier segment 410c of conductive carrier 410.

Referring to FIG. 4B, power semiconductor package 412 of FIG. 4B includes power transistor 420, conductive adhesive 419, conductive adhesive 421, and conductive carrier 410. Conductive carrier 410 includes power electrode conductive carrier segment 410a, partially etched conductive carrier segment 410b, and partially etched conductive carrier segment 410c. It should be noted that in some implementations, power transistor 420 is implemented using the configuration of power transistor 320 of FIG. 3.

Power transistor 420 is configured to be coupled to partially etched conductive carrier segment 410b, partially etched conductive carrier segment 410c, and power electrode heat spreader 440 of FIG. 4C and FIG. 4D. In one implementation, power transistor 420 may take the form of group IV material based FET, such as a silicon metal-oxide-semiconductor FET (MOSFET), for example. However, in other implementations, power transistor 420 may take the form of group III-V based power FET, such as a GaN or other III-Nitride based FET. As discussed above in reference to FIG. 1, power transistor 420 may be implemented as control transistor 120 and/or sync transistor 130 according to voltage converter 100 of FIG. 1.

Partially etched conductive carrier segment 410b of conductive carrier 410 is configured to be electrically and mechanically coupled to power transistor 410 using conductive adhesive 419. More specifically, in an implementation where power transistor 420 has the configuration of power transistor 320 of FIG. 3, partially etched conductive carrier segment 410b is configured to be electrically and mechanically coupled to the source electrode of power transistor 420, such as source electrode 324 of FIG. 3.

Partially etched conductive carrier segment 410c of conductive carrier 410 is configured to be electrically and mechanically coupled to power transistor 410 using conductive adhesive 421. More specifically, in an implementation where power transistor 420 has the configuration of power transistor 320 of FIG. 3, partially etched conductive carrier segment 410c is configured to be electrically and mechanically coupled to the gate electrode of power transistor 420, such as gate electrode 326 of FIG. 3.

Referring again to flowchart 200, flowchart 200 continues at action 214 with attaching a power electrode heat spreader to the power transistor and to a power electrode segment of the conductive carrier. For example, power semiconductor package 414 of FIG. 4C includes power semiconductor package 412 of FIG. 4B after power electrode heat spreader 440 is attached to power transistor 420 and to power electrode conductive carrier segment 410a of conductive carrier 410.

Referring to FIG. 4C, power semiconductor package 414 of FIG. 4C includes power transistor 420, conductive adhesive 419, conductive adhesive 421, conductive adhesive 423, conductive adhesive 429, power electrode heat spreader 440, and conductive carrier 410. Conductive carrier 410 includes power electrode conductive carrier segment 410a, partially etched conductive carrier segment 410b, and partially etched conductive carrier segment 410c. It should be noted that in some implementations, power transistor 420 is implemented using the configuration of power transistor 320 of FIG. 3.

Power electrode heat spreader 440 is configured to be electrically and mechanically coupled to power transistor 420 and power electrode conductive carrier segment 410a. More specifically, in an implementation where power transistor 420 has the configuration of power transistor 320 of FIG. 3, power electrode heat spreader 440 is configured to be electrically and mechanically coupled to the drain electrode of power transistor 420, such as drain electrode 322 of FIG. 3.

Power electrode heat spreader 440 is configured to be electrically and mechanically coupled to power transistor 420 using conductive adhesive 423. Power electrode heat spreader 440 is configured to be electrically and mechanically coupled to power electrode conductive carrier segment 410a using conductive adhesive 429.

Power electrode heat spreader 440 may be a flat, electrically and thermally conductive body, having a substantially planar bottom for attachment to power transistor 420 and power electrode conductive carrier segment 410a. Power electrode heat spreader 440 may include Cu, Al, a conductive alloy, or another suitable conductive material, for example.

In addition to coupling the drain electrode of power transistor 420 to power electrode conductive carrier segment 410a, power electrode heat spreader 440 is configured to provide integrated heat spreading functionality for dissipation of heat generated by power transistor 420. Power electrode conductive carrier segment 410a of conductive carrier 410 is configured to be electrically and mechanically coupled to power electrode heat spreader 440 using conductive adhesive 429.

Conductive adhesive 419, 421, 423, and 429 may include a conductive adhesive material, a solder paste, solder tape, solder, a silver filled adhesive such as QMI 529HT, a conductive sintered material, a diffusion bonded material, or another suitable attachment means. Conductive adhesive 419, 421, 423, and 429 may be formed to a thickness of at least 10 μm, for example.

Referring to FIG. 4D, FIG. 4D illustrates a cross-sectional view of an implementation of the present disclosure. Power semiconductor package 415 includes power transistor 420, conductive adhesive 419, conductive adhesive 421, conductive adhesive 423, conductive adhesive 429, power electrode heat spreader 440, substrate 480, molding compound 460, and conductive carrier 410. Conductive carrier 410 includes power electrode conductive carrier segment 410a, partially etched conductive carrier segment 410b, and partially etched conductive carrier segment 410c. It should be noted that in some implementations, power transistor 420 is implemented using the configuration of power transistor 320 of FIG. 3.

For example, power semiconductor package 415 of FIG. 4D includes power semiconductor package 414 of FIG. 4C after encapsulating power semiconductor package 414 in molding compound 460 and coupling power semiconductor package 414 to substrate 480. More specifically, power electrode conductive carrier segment 410a, partially etched conductive carrier segment 410b, and partially etched conductive carrier segment 410c of power semiconductor package 415 are electrically and mechanically coupled to substrate 480 using solder bodies, a conductive adhesive, or another suitable attachment means, for example.

In an implementation where power transistor 420 has the configuration of power transistor 320 of FIG. 3, partially etched conductive carrier segment 410b couples the source electrode of power transistor 420 to substrate 480, partially etched conductive carrier segment 410c couples the gate electrode of power transistor 420 to substrate 480, and the combination of power electrode heat spreader 440 and power electrode conductive carrier segment 410a couples the drain electrode of power transistor 420 to substrate 480.

Molding compound 460 is configured to encapsulate power semiconductor package 415 to provide protection for power semiconductor package 415. Molding compound 460 may include any suitable molding compound or a plastic case.

Substrate 480 includes a plurality of portions configured to electrically couple to the power electrodes and gate electrode of power semiconductor package 415. Power electrode conductive carrier segment 410a, partially etched conductive carrier segment 410b, and partially etched conductive carrier segment 410c are electrically and mechanically coupled to substrate 480 using conductive pads or a conductive adhesive, for example. Substrate 480 may be a circuit board, for example a printed circuit board (PCB), or another suitable substrate.

Substrate 480 uses conductive traces or other conductive means to electrically couple the required components of power semiconductor package 415. For example, in an implementation where power transistor 420 has the configuration of power transistor 320 of FIG. 3, substrate 480 may include conductive traces to electrically couple each of the source electrode, the gate electrode, and the drain electrode of power transistor 420, such as source electrode 324, gate electrode 326, and drain electrode 322 of power transistor 320, for example.

Figure 5:
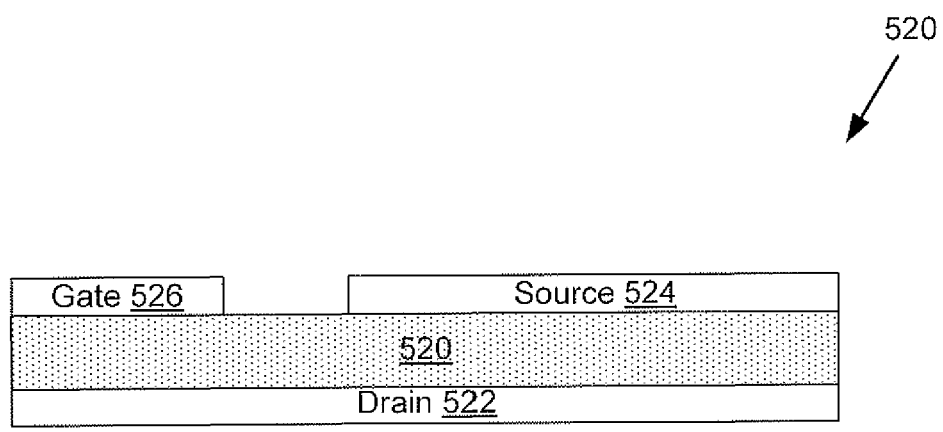
FIG. 5 illustrates a cross-sectional view of another power transistor for use in a power semiconductor package.

Referring to FIG. 5, FIG. 5 illustrates a simplified cross-sectional view of a power transistor for use in a power semiconductor package. Power transistor 520 of FIG. 5 includes drain electrode 522, source electrode 524, and gate electrode 526. Drain electrode 522 is a power electrode situated on a bottom surface of power transistor 520. Source electrode 524 is a power electrode situated on a top surface of power transistor 520. Gate electrode 526 is a gate electrode situated on the top surface of power transistor 520. In some implementations, power transistor 620 of FIG. 6A, FIG. 6B, and FIG. 6C discussed below have the same drain electrode, source electrode, and gate electrode configuration as power transistor 520 of FIG. 5. However, the present disclosure is not limited to the implementation of FIG. 5. For example, in one implementation, the configuration of source electrode 524 and gate electrode 526 of power transistor 520 may be reversed.

Referring to FIG. 6A, FIG. 6A illustrates a top view of another implementation of the present disclosure. Power semiconductor package 616A of FIG. 6A includes power transistor 620, power electrode heat spreader 640, gate electrode heat spreader 650, power electrode conductive carrier segment 610a, and gate electrode conductive carrier segment 610d. It should be noted that power electrode heat spreader 640 is similar to power electrode heat spreader 440 of FIG. 4C and FIG. 4D, and power electrode conductive carrier segment 610a is similar to power electrode conductive carrier segment 410a of FIG. 4A, FIG. 4B, FIG. 4C, and FIG. 4D. It should further be noted that in some implementations, power transistor 620 is implemented using the configuration of power transistor 520 of FIG. 5.

Power electrode heat spreader 640 may have an "L" shape, as illustrated in FIG. 6A, or power electrode heat spreader 640 may have a different shape to cover more or less space on power transistor 620 depending on the current carrying capability and thermal dissipation requirements of power electrode heat spreader 640.

Gate electrode heat spreader 650 may have a rectangular shape, as illustrated in FIG. 6A, or gate electrode heat spreader 650 may have a different shape to cover more or less space on power transistor 620 depending on the current carrying capability and thermal dissipation requirements of gate electrode heat spreader 650. In some implementations, gate electrode heat spreader 650 may be replaced with a wire bond, specifically if the current carrying capability and thermal dissipation requirements of gate electrode heat spreader 650 are low. The wire bond may include gold (Au) or Cu, for example. In other implementations, however, the wire bond may be replaced by conductive ribbons or other connectors formed form conductive materials such as Al, Au, Cu, and/or other metals or composite materials.

Referring again to flowchart 200, flowchart 200 continues at action 216 with attaching a gate electrode heat spreader to the power transistor and to a gate electrode segment of the conductive carrier. For example, in power semiconductor package 216 of FIG. 6B, gate electrode heat spreader 650 is attached to power transistor 620 and to gate electrode conductive carrier segment 610*d* of conductive carrier 610.

Referring to FIG. 6B, power semiconductor package 616B of FIG. 6B includes a cross-sectional view of power semiconductor package 616A of FIG. 6A along dashed lines 6B-6B. Power semiconductor package 616E of FIG. 6B includes power transistor 620, power electrode heat spreader 640, gate electrode heat spreader 650, conductive carrier 610, conductive adhesive 627, conductive adhesive 621, conductive adhesive 623, and conductive adhesive 625. Conductive carrier 610 includes gate electrode conductive carrier segment 610*d* and partially etched conductive carrier segment 610*b*. It should be noted that power electrode heat spreader 640 is similar to power electrode heat spreader 440 of FIG. 4C and FIG. 4D and conductive carrier 610 is similar to conductive carrier 410 of FIG. 4A, FIG. 4B, FIG. 4C, and FIG. 4D. It should further be noted that in some implementations, power transistor 620 is implemented using the configuration of power transistor 520 of FIG. 5.

Gate electrode heat spreader 650 is configured to couple a gate electrode of power transistor 620 to gate electrode conductive carrier segment 610*d*. In an implementation where power transistor 620 has the configuration of power transistor 520 of FIG. 5, gate electrode heat spreader 650 is configured to couple the gate electrode of power transistor 620 to gate electrode conductive carrier segment 610*d*, such as gate electrode 526 of power transistor 520 in FIG. 5.

Gate electrode heat spreader 650 is configured to be electrically and mechanically coupled to power transistor 620 using conductive adhesive 627. Gate electrode heat spreader 650 is further configured to be electrically and mechanically coupled to gate electrode conductive carrier segment 610*d* using conductive adhesive 625.

Gate electrode heat spreader 650 may be a flat, electrically and thermally conductive body, having a substantially planar bottom for attachment to power transistor 620 and gate electrode conductive carrier segment 610*d*. Gate electrode heat spreader 650 may include Cu, Al, a conductive alloy, or another suitable conductive material, for example.

Gate electrode conductive carrier segment 610*d* is configured to couple gate electrode heat spreader 650 to a substrate, for example. Gate electrode conductive carrier segment 610*d* is configured to be electrically and mechanically coupled to gate electrode heat spreader 650 using conductive adhesive 625.

Partially etched conductive carrier segment 610*b* is configured to couple a power electrode of power transistor 620 to a substrate, for example. In an implementation where power transistor 620 has the configuration of power transistor 520 of FIG. 5, partially etched conductive carrier segment 610*b* is configured to couple the drain electrode of power transistor 620 to a substrate, such as drain electrode 522 of power transistor 520 in FIG. 5. Partially etched conductive carrier segment 610*b* is configured to be electrically and mechanically coupled to power transistor 620 using conductive adhesive 621.

Conductive adhesive 621, 623, 625, and 627 may include a conductive adhesive material, a solder paste, solder tape, solder, a silver filled adhesive such as QMI 529HT, a conductive sintered material, a diffusion bonded material, or another suitable attachment means. Conductive adhesive 621, 623, 625, and 627 may be formed to a thickness of at least 10 μm, for example.

In some implementations, power semiconductor package 616B may be coupled to a substrate, similar to power semiconductor package 415 of FIG. 4D. In such an implementation, and where power transistor 620 has the configuration of power transistor 520 of FIG. 5, partially etched conductive carrier segment 610*b* couples the drain electrode of power transistor 620 to the substrate, and the combination of gate electrode heat spreader 650 and gate electrode conductive carrier segment 610*d* couples the gate electrode of power transistor 620 to the substrate. In yet another implementation, power semiconductor package 616B may be encapsulated in a molding compound, for example, similar to power semiconductor package 415 of FIG. 4D.

Referring to FIG. 6C, FIG. 6C illustrates a cross-sectional view of another implementation of the present disclosure. More specifically, power semiconductor package 616C of FIG. 6C includes a cross-sectional view of power semiconductor package 616A of FIG. 6A along dashed lines 6C-6C. Power semiconductor package 616C of FIG. 6C includes power transistor 620, power electrode heat spreader 640, conductive adhesive 621, conductive adhesive 623, conductive adhesive 629, and conductive carrier 610. Conductive carrier 610 includes power electrode conductive carrier segment 610*a* and partially etched conductive carrier segment 610*b*. It should be noted that power electrode heat spreader 640 is similar to power electrode heat spreader 440 of FIG. 4C and FIG. 4D and conductive carrier 610 is similar to conductive carrier 410 of FIG. 4A, FIG. 4B, FIG. 4C, and FIG. 4D. It should further be noted that in some implementations, power transistor 620 is implemented using the configuration of power transistor 520 of FIG. 5.

Power electrode heat spreader 640 is configured to couple a power electrode of power transistor 620 to power electrode conductive carrier segment 610*a*. In an implementation where power transistor 620 has the configuration of power transistor 520 of FIG. 5, power electrode heat spreader 640 is configured to couple the source electrode of power transistor 620 to power electrode conductive carrier segment 610*a*, such as source electrode 524 of power transistor 520 of FIG. 5. Power electrode conductive heat spreader 640 is configured to be electrically and mechanically coupled to power electrode conductive carrier segment 610*a* using conductive adhesive 629.

Conductive adhesive 629 may include a conductive adhesive material, a solder paste, solder tape, solder, a silver filled adhesive such as QMI 529HT, a conductive sintered material, a diffusion bonded material, or another suitable attachment means. Conductive adhesive 629 may be formed to a thickness of at least 10 μm, for example.

In some implementations, power semiconductor package 616C may be coupled to a substrate, similar to power semiconductor package 415 of FIG. 4D. In such an implementation, and where power transistor 620 has the configuration of power transistor 520 of FIG. 5, the combination of power electrode heat spreader 640 and power electrode conductive carrier segment 610a couples the source electrode of power transistor 620 to the substrate.

Thus, use of at least one heat spreader implemented as a power electrode or gate electrode contact of a power transistor provides integrated heat spreading in a compact power semiconductor package design, while concurrently providing thermal dissipation and protection for the power transistor. For example, a package height, or thickness, resulting from the implementations disclosed in the present application may be less than approximately 0.5 mm, and in one implementation may have a package height or thickness of approximately 0.45 mm. Furthermore, use of the heat spreader to provide the power electrode or gate electrode contact advantageously enables omission of a conductive clip having a support leg, or any other feature implemented solely as an electrical connector for the power electrode or gate electrode of the power transistor, from the semiconductor package.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A power semiconductor package comprising:
   a power transistor that includes a first power electrode and a gate electrode on a bottom surface of said power transistor, and a second power electrode on a top surface of said power transistor;
   said first power electrode that is configured for attachment to a first partially etched conductive carrier segment;
   said gate electrode that is configured for attachment to a second partially etched conductive carrier segment;
   a power electrode heat spreader that is configured to electrically couple said second power electrode to a power electrode conductive carrier segment; and
   a gate electrode heat spreader that has a contact surface, wherein the gate electrode heat spreader is configured to contact said gate electrode and a gate electrode carrier segment along said contact surface to electrically couple said gate electrode to said gate electrode carrier segment.

2. The power semiconductor package of claim 1, wherein said first partially etched conductive carrier segment, said second partially etched conductive carrier segment, and said power electrode conductive carrier segment are configured for attachment to a substrate.

3. The power semiconductor package of claim 2, wherein said substrate is a circuit board.

4. The power semiconductor package of claim 1, wherein said power transistor is selected from the group consisting of a FET, an IGBT, and a HEMT.

5. The power semiconductor package of claim 1, wherein said power transistor is selected from the group consisting of a silicon FET and a GaN FET.

6. The power semiconductor package of claim 1, wherein said first power electrode is a source electrode.

7. The power semiconductor package of claim 1, wherein said second power electrode is a drain electrode.

8. The power semiconductor package of claim 1, wherein said power transistor is part of a voltage converter.

9. The power semiconductor package of claim 1, wherein said power semiconductor package is encapsulated in a molding compound.

10. The power semiconductor package of claim 1, wherein said power electrode conductive carrier segment is thicker than said first and said second partially etched conductive carrier segments.

11. A power semiconductor package comprising:
    a power transistor that includes a first power electrode and a gate electrode on a top surface of said power transistor, and a second power electrode on a bottom surface of said power transistor;
    said second power electrode that is configured for attachment to a partially etched conductive carrier segment;
    a power electrode heat spreader that is configured to electrically couple said first power electrode to a power electrode conductive carrier segment; and
    a gate electrode heat spreader that has a contact surface, wherein the gate electrode heat spreader is configured to contact said gate electrode and a gate electrode carrier segment along said contact surface to electrically couple said gate electrode to said gate electrode carrier segment.

12. The power semiconductor package of claim 11, wherein said partially etched conductive carrier segment, said power electrode conductive carrier segment, and said gate electrode conductive carrier segment are configured for attachment to a substrate.

13. The power semiconductor package of claim 12, wherein said substrate is a circuit board.

14. The power semiconductor package of claim 11, wherein said power transistor is selected from the group consisting of a FET, an IGBT, and a HEMT.

15. The power semiconductor package of claim 11, wherein said power transistor is selected from the group consisting of a silicon FET and a GaN FET.

16. The power semiconductor package of claim 11, wherein said first power electrode is a source electrode.

17. The power semiconductor package of claim 11, wherein said second power electrode is a drain electrode.

18. The power semiconductor package of claim 11, wherein said power transistor is part of a voltage converter.

19. The power semiconductor package of claim 11, wherein said power semiconductor package is encapsulated in a molding compound.

20. The power semiconductor package of claim 11, wherein said power electrode conductive carrier segment and said gate electrode conductive carrier segment are thicker than said first and said second partially etched conductive carrier segments.

21. The power semiconductor package of claim 1, wherein said gate electrode heat spreader has an invariant cross-section.

22. The power semiconductor package of claim 11, wherein said gate electrode heat spreader that has a constant cross-sectional area.

* * * * *